(12) United States Patent
Kuo et al.

(10) Patent No.: US 9,519,735 B2
(45) Date of Patent: Dec. 13, 2016

(54) METHOD OF FAILURE ANALYSIS

(71) Applicant: Taiwan Semiconductor Manufacturing Co., Ltd., Hsin-Chu (TW)

(72) Inventors: Chin-Cheng Kuo, Taoyuan (TW); Kmin Hsu, Hsinchu (TW); Wei-Yi Hu, Zhubei (TW); Wei Min Chan, Sindian (TW); Jui-Feng Kuan, Zhubei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 123 days.

(21) Appl. No.: 14/492,866

(22) Filed: Sep. 22, 2014

(65) Prior Publication Data

US 2015/0089463 A1    Mar. 26, 2015

Related U.S. Application Data

(60) Provisional application No. 61/946,348, filed on Feb. 28, 2014, provisional application No. 61/881,091, filed on Sep. 23, 2013.

(51) Int. Cl.
*G06F 17/50* (2006.01)

(52) U.S. Cl.
CPC ....... *G06F 17/5009* (2013.01); *G06F 17/5036* (2013.01)

(58) Field of Classification Search
CPC .............. G06F 17/5022; G06F 17/5027; G06F 17/5031; G06F 2217/10; G06F 11/25; G06F 17/5009; G06F 17/18; G01R 31/31704; G01R 31/3177; G01R 31/31857; H01L 22/34
USPC ...................... 716/106–107, 136; 703/13–14
See application file for complete search history.

(56) References Cited

U.S. PATENT DOCUMENTS

| | | | |
|---|---|---|---|
| 2005/0128489 A1* | 6/2005 | Bao ...................... | G01B 11/303 356/601 |
| 2008/0295046 A1* | 11/2008 | Su ........................ | G06F 17/5068 716/136 |
| 2011/0289463 A1* | 11/2011 | Cases .................. | G06F 17/5063 716/106 |

OTHER PUBLICATIONS

"Monte Carlo Simulation in HSPICE." Analog Integrated Circuits Design, Fall 2007.
Wikipedia.org. "PSpice." Jul. 16, 2013.

* cited by examiner

*Primary Examiner* — Nghia Doan
(74) *Attorney, Agent, or Firm* — Eschweiler & Associates, LLC

(57) ABSTRACT

In some methods, a number of input data sets is provided for an integrated circuit (IC) model. A number of scores for the number of input data sets, respectively, are then determined based on probabilities of the respective input data sets resulting in a failure condition, which exists when the IC model fails to meet a predetermined yield criteria. A simulation order for the number of input data sets is then assigned according to the determined number of scores.

17 Claims, 6 Drawing Sheets

200

```
┌─────────────────────────────────────────────────────────────────┐
│ Generate a plurality of input data sets for a device model,      │──202
│ wherein each input data set is made up of the same input device  │
│ parameters but where individual parametric values are different  │
│ for different input data sets                                    │
└─────────────────────────────────────────────────────────────────┘
                              ▼
┌─────────────────────────────────────────────────────────────────┐
│ Perform a first (baseline) simulation by applying a first input  │──204
│ data set to the model                                            │
└─────────────────────────────────────────────────────────────────┘
                              ▼
┌─────────────────────────────────────────────────────────────────┐
│ Perform a second simulation by applying a second input data set  │
│ to the model, wherein a first of the parametric values in the    │──206
│ second input data set is altered from a corresponding parametric │
│ value of the first input data set                                │
└─────────────────────────────────────────────────────────────────┘
                              ▼
┌─────────────────────────────────────────────────────────────────┐
│ Perform a third simulation by applying a third input data set to │
│ the model, wherein a second of the parametric values in the      │──208
│ third input data set is altered from a corresponding parametric  │
│ value of the first and second input data sets                    │
└─────────────────────────────────────────────────────────────────┘
                              ▼
┌─────────────────────────────────────────────────────────────────┐
│ Compare results of the first, second, and third simulations to   │──210
│ determine a sensitivity of the model to the altered parametric   │
│ values                                                           │
└─────────────────────────────────────────────────────────────────┘
                              ▼
┌─────────────────────────────────────────────────────────────────┐
│ Based on the determined sensitivity, define an order for which   │
│ remaining data sets of the plurality of data sets are to be      │──212
│ simulated, wherein input data sets that exhibit higher           │
│ sensitivity are simulated prior to data sets exhibiting lower    │
│ sensitivity                                                      │
└─────────────────────────────────────────────────────────────────┘
```

| Simulation No. (i) | Input Device Parameter to be evaluated | Parametric Values | $I_{D,i}$ (nA) | Sensitivity of input parameter ($s_j$) | Weighted Sensitivity of input parameter ($w_j$) |
|---|---|---|---|---|---|
| i=0 | - | $L_g$=500, $V_{th}$=0.5, $\mu_e$=.025 | 250 | - | - |
| i=1 | Gate length (j=1) | $L_g$=150, $V_{th}$=0.5, $\mu_e$=.025 | 75 | 0.3 | 0.25 |
| i=2 | Threshold Voltage (j=2) | $L_g$=500, $V_{th}$=0.4, $\mu_e$=.025 | 300 | 1.2 | 1 |
| i=3 | Electron Mobility (j=3) | $L_g$=500, $V_{th}$=0.5, $\mu_e$=.015 | 150 | 0.6 | 0.5 |

| Simulation Number | 506 Random parametric value, j=1 $X_{LG}$ (nm) | 507 Parametric Value Probability ($P_{XLG}$) | 508 Random parametric value, j=2 $X_{VTH}$ (V) | 509 Parametric Value Probability ($P_{XVTH}$) | 510 Random parametric Value, j=3, $X_{\mu e}$ ($m^2/(V \times sec)$) | 511 Parametric Value Probability ($P_{X\mu e}$)** | Data Set Output value $I_{D,i}$ (nA) | 512 Input Data Set Probability $P_i = \prod_{j=1}^{n} P_{xij}$ $P_i = P_{XLG} * P_{XVTH} * P_{X\mu e}$ | 514 Set Score*** $P_i / \{\sum_{j=1}^{n} x_{ij} \bullet w_j \}^2$ |
|---|---|---|---|---|---|---|---|---|---|
| Nominal | 500 | | 0.5 | | 0.025 | | 250 | 0.63 | 260 |
| i=4 | 250 | | 0.35 | | 0.01 | | 345 | 0.27 | 45 |
| i=5 | 545 | | 0.3 | | 0.03 | | 212 | 0.51 | 120 |
| i=6 | 605 | | 0.95 | | 0.045 | | 410 | 0.06 | 32 |
| i=7 | 880 | | 0.2 | | 0.065 | | 185 | 0.43 | 64 |
| i=8 | 790 | 0.09** | 0.1 | 0.15** | 0.02 | 0.13** | 53 | 0.0011 | 3 |
| i=9 | 370 | | 0.65 | | 0.03 | | 455 | 0.02 | 20 |
| i=10 | 600 | | 0.25 | | 0.035 | | 120 | 0.17 | 45 |
| i=11 | 625 | | 0.6 | | 0.02 | | 378 | 0.09 | 32 |
| i=12 | 120 | | 0.45 | | 0.015 | | 238 | 0.62 | 200 |
| i=13 | 735 | | 0.85 | | 0.04 | | 288 | 0.53 | 160 |

**Input Data Set Probability $P_{Xij} = \dfrac{1}{\sqrt{2\pi}} \int_{a_{ij} \bullet w_j}^{b_{ij} \bullet w_j} e^{-t^2/2} dt$ calculated by:

***Set Score = $P_i / \{ [(X_{Lg} \times W_{Lg}) + (X_{Vth} \times W_{Vth}) + (X_{\mu e} \times W_{\mu e})]\}^2$

METHOD OF FAILURE ANALYSIS

RELATED APPLICATION

This application claims priority to a first U.S. Provisional patent application entitled, "Method of Failure Analysis", which was filed on Sep. 23, 2013 and assigned application Ser. No. 61/881,091. This application hereby incorporates by reference all subject matter of this first provisional application.

This application also claims priority to a second U.S. Provisional patent application entitled, "Method of Failure Analysis", which was filed on Feb. 28, 2014 and assigned application Ser. No. 61/946,348. This application hereby incorporates by reference all subject matter of this second provisional application.

BACKGROUND

Modern integrated circuits (ICs), which can be classified as digital, analog, or mixed signal, can provide extremely complex functionality. A single IC can include millions or billions transistors, each of which can switch on and off at billions of times each second, causing minute amounts of current to propagate through various pathways within the ICs. In the design phase of an IC, a designer specifies a set of target process parameters, such as gate length, electron mobility, and voltage threshold, for each transistor on an IC prior to manufacturing.

Due to the extremely small feature sizes and complex functionality involved, manufacturing such ICs can take several months from start to finish in many instances. A fabrication facility attempts to manufacture each transistor so that each transistor has precisely the target process parameters specified by the designer. Thus, when the final IC is manufactured, the aim is for the manufactured IC to meet the performance metrics envisioned by the designer. However, due to small, unpredictable variations in the manufacturing environment, transistors on a given IC and across multiple ICs will exhibit variations in performance. Process corners are used to characterize these manufacturing variations. Process corners represent different conditions of manufacturing variations within which a circuit functions correctly.

FIG. 1 shows an example process corner chart 100 for a large number of manufactured devices with manufacturing variations there between. In particular, along the x-axis, FIG. 1 illustrates current variation ($I_n$) for identically specified NMOS devices having a first target set of conditions (i.e., a predetermined gate-source voltage ($V_{GSN}$), drain-source voltage ($V_{DSN}$), gate width ($W_N$), and gate length ($L_N$)). Along the y-axis, the chart illustrates current variation ($I_p$) for identically specified PMOS devices having a second target set of conditions (i.e., a predetermined $V_{GSP}$, $V_{DSP}$, $W_P$, and $L_P$). Because of manufacturing variation, the NMOS and PMOS devices each have slightly different currents $I_n$, $I_p$ that fall within a polygon 102 bounded by four process corners. Some ICs exhibit the specified target behavior (referred to as "nominal" or "typical-typical" devices) and are represented by point 104. Other devices are classified as being fast/fast (represented by corner 106), slow/slow (represented by corner 108), or "skewed". "Skewed" corners can be fast/slow (represented by corner 110) or slow/fast (represented by corner 112). Thus, a single, randomly selected device formed by this process may run slower or faster than specified by a designer, depending on whether its manufactured devices statistically fall nearer a fast process corner or a slow process corner. If not accurately accounted for, this manufacturing variation among devices and ICs can potentially reduce the overall yield, and correspondingly reduce the number of viable ICs produced over time.

To account for these process corners prior to submitting an IC design to the fabrication facility, design engineers simulate each IC, for example in a Simulation Program with Integrated Circuit Emphasis (SPICE) simulation. To predict possible manufacturing outcomes, these SPICE simulations use a technique referred to as Monte-Carlo modeling, where the IC is simulated a large number of times with different, randomly-chosen device parameters selected for each simulation. Each simulation provides a different point on a process corner chart. Thus, some simulated device parameters result in fast/fast or slow/slow devices or ICs, other simulated device parameters result in skewed devices or ICs, while still other simulated device parameters result in devices or ICs falling elsewhere within the polygonal bounds of process corners provided by a fabrication facility.

Randomly varying the device parameters in these Monte Carlo simulations models the vast number of possible manufacturing variations that can occur when the device is actually manufactured. Designers can then identify worst case scenarios where, although the device parameters fall within established process corners, the proposed design still fails to meet its design specifications. For example, if a design specification calls for an IC to be stable for all clock frequencies between 1.1 GHz and 1.3 GHz over a temperature range of −10° C. to 80° C. (and process corners allow MOSFET voltage thresholds and electron mobility to each vary by as much as 10% while remaining within the process corners), simulations might show the IC is expected to fail for a worst-case scenario at the 1.3 GHz clock frequency at 80° C. when MOSFET voltage thresholds are 10% higher than a target voltage threshold and when MOSFET electron mobility is 10% lower than a target electron mobility. If a worst case failure scenario is identified, the designers can tune the proposed design to make it more robust to stay within the design specifications.

Unfortunately, carrying out the vast number of Monte Carlo simulations required to identify whether an IC might fail to meet its design specifications can take a significant amount of time and computing resources.

BRIEF DESCRIPTION OF THE DRAWINGS

FIG. 2 illustrates a flow chart of some embodiments of a method of prioritizing circuit simulations to achieve fast failure analysis.

FIG. 3 illustrates some embodiments of a non-limiting example of sensitivity analysis.

FIG. 5 illustrates some embodiments of a non-limiting example of how scores can be determined for simulation priority.

DETAILED DESCRIPTION

Figure 1:
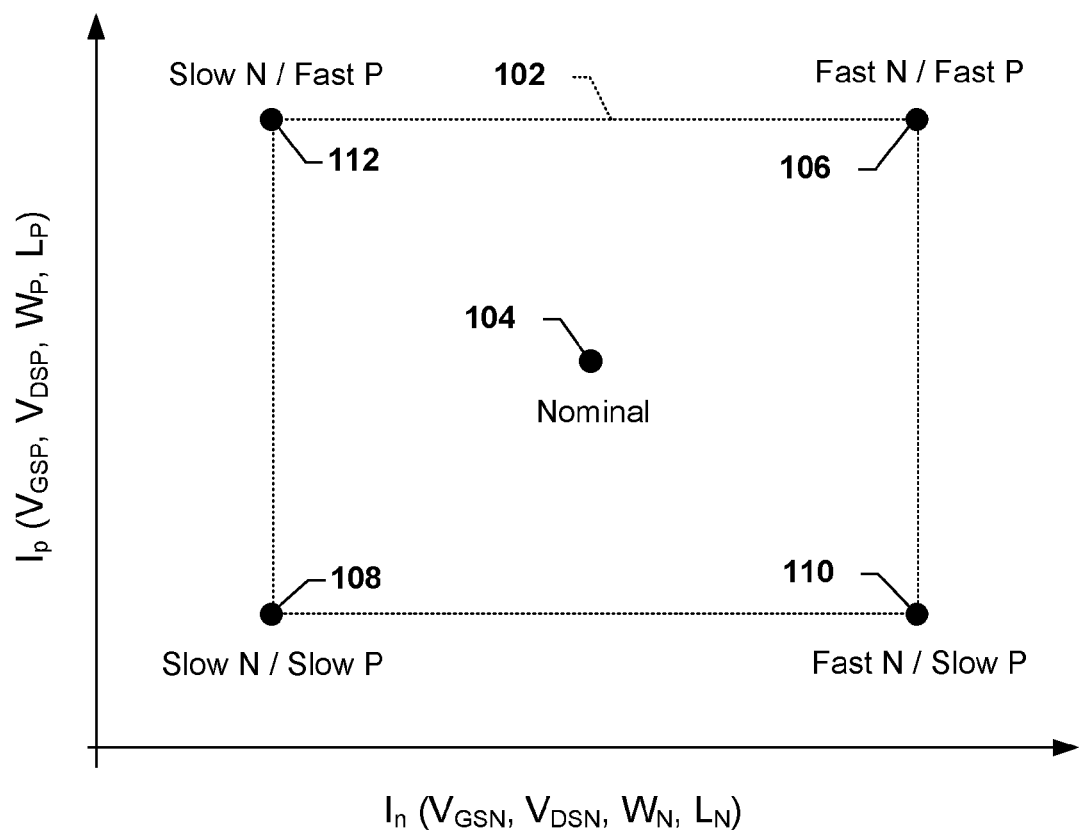
FIG. 1 illustrates an example chart showing process corners used to characterize a manufacturing process.

The description herein is made with reference to the drawings, where like reference numerals are generally utilized to refer to like elements throughout, and where the various structures are not necessarily drawn to scale. In the following description, for purposes of explanation, numerous specific details are set forth in order to facilitate understanding. It is evident, however, that one or more aspects described herein may be practiced with a lesser degree of these specific details. In other instances, known structures and devices are shown in block diagram form to facilitate understanding.

Some embodiments of the present disclosure relate to a method to predict a worst-case outcome from among a plurality of simulations to be carried out for an IC. A first simulation of the IC is performed by utilizing initial values of a plurality of input parameters (e.g., device dimensions, electrical characteristics, etc.). The value of one or more of the input parameters is then altered from its initial value while the remaining parameters are held constant, and the IC is re-simulated in a second simulation using the altered input parameter(s). Results of the first and second simulations are compared to determine a sensitivity of a simulated result to the alteration of the one or more of the input parameters. The input parameters are then repeatedly changed and re-simulated across the plurality of input parameters to determine sensitivities for each input parameter. To predict worst case outcomes early in simulation, an order for subsequent simulations is defined according to the determined sensitivities. Input parameters that exhibit higher sensitivity tend to be simulated prior to those with lower sensitivity. Hence, the simulation methods disclosed herein help to expedite the design flow and verification for designers, in that it allows worst-case scenarios to be quickly identified and verified compared to other simulation techniques.

FIG. 2 illustrates a simulation method 200 in accordance with some embodiments of the present disclosure. At 202, an integer number of input data sets are generated for a device model. The device model can be a MOSFET, an IC made up of a large number of MOSFETs, and/or other semiconductor devices. Each input data set is made up of the same input device parameters, but individual parametric values are different for different input data sets. For example, in an embodiment where the device model is a MOSFET, each input data set can be made up of input device parameters including gate length, threshold voltage, electron mobility for the MOSFET, etc. To predict how these input device parameters can vary, which can occur due to small variations in the manufacturing process when the device is actually fabricated, the number of input data sets is designed to provide a representation of the possible range of values expected to be encountered when a large number of such devices are manufactured.

At 204, a first or "baseline" simulation is performed by applying a first input data set to the model, and a first simulation result is obtained. For example, in the first simulation, the first input data set can include a first transistor gate length and first threshold voltage for the MOSFET.

At 206, a second simulation is performed by applying a second input data set to the model, and a second simulation result is obtained. In this second simulation, the second input data set has a parametric value that differs from its corresponding value in the first input data set. For example, if the first transistor gate length and first threshold voltage were 15 nm and 1.2 volts (V) in the first simulation, the second simulation can use a second transistor gate length that differs from 15 nm by some predetermined amount or percentage while the threshold voltage can be kept constant at 1.2 V. For instance, the second transistor gate length could be set to 16 nm to reflect a sample manufacturing variation for the MOSFET. As a result of the altered transistor gate length, the second simulation result can differ from the first simulation result.

At 208, a third simulation is performed by applying a third input data set to the model, and a third simulation result is obtained. In this third simulation, the third input data set has a parametric value that differs from its corresponding value in the first and second input data sets. For example, if the first transistor gate length and first threshold voltage were 15 nm and 1.2 volts (V) in the first simulation, the third simulation can use a second voltage threshold that differs from 1.2 V by some predetermined amount or percentage while the transistor gate length can be kept constant at 15 nm. For instance, the second threshold voltage could be set to 1.1 V to reflect a sample manufacturing variation for the MOSFET. As a result of the altered threshold voltage, the third simulation result can differ from the first and/or second simulation results.

At 210, the results of the first, second, and third simulations are compared to determine a sensitivity of the model to variations in the parametric values. The determined sensitivity represents how quickly the output result of the simulation responds to slight alterations in the one or more parametric values. For example, if a difference between the first and second simulation results is greater than a difference between the first and third simulation results, then the simulated device has a higher sensitivity to the first parametric value. For instance, if this were the case for the example described in the preceding three paragraphs, the simulated MOSFET would exhibit a higher sensitivity to transistor gate length variation than voltage threshold variation. Conversely, if a difference between the first and third simulation results is greater than a difference between the first and second simulation results, then the simulated device has a higher sensitivity to the second parametric value. For instance, if this were the case for the example described in the preceding three paragraphs, the simulated MOSFET would exhibit a higher sensitivity to voltage threshold variation than transistor gate length variation.

At 212, based on the determined sensitivity, the method determines an order for which remaining data sets are to be simulated. In this ordering, input data sets that tend to exhibit higher sensitivities are simulated prior to data sets exhibiting lower sensitivities. For example, if the simulation is more sensitive to voltage threshold variations, then input data sets that collectively exhibit changes in threshold voltage would be simulated before input data sets that collectively exhibit changes in gate length with constant threshold voltages. In some embodiments, each data set is assigned a "score" whose value corresponds to a likelihood of that data set actually occurring. In some embodiments, data sets that are likely to cause failures, such as data sets for the worst case scenarios, are simulated earlier in the simulation order compared to data sets that are unlikely to cause failures. Compared to other approaches, this quick identification of the "worst case" scenarios allows designers to make adjustments to their designs earlier in the process and allows for faster design turnarounds compared to other approaches. Therefore, designs can be churned out faster and with higher yields than other approaches.

While method 200 of FIG. 2 and other methods illustrated and/or described herein may be illustrated or described as a series of acts or events, it will be appreciated that the ordering of such acts or events are not to be interpreted in a limiting sense. For example, some acts may occur in different orders and/or concurrently with other acts or events apart from those illustrated and/or described herein. For instance, although the method in FIG. 2 shows the plurality of input data sets being generated in 202, the input data sets can be generated at various times throughout the method and need not be generated entirely at the beginning of the method 100. In addition, not all illustrated acts may be required to implement one or more aspects or embodiments of the description herein. Further, one or more of the acts depicted herein may be carried out in one or more separate acts and/or phases. For example, generation of the input sets, which is illustrated solely as occurring at 202, can be carried out in several acts or phases which are distributed throughout the method 200.

As a non-limiting example of methodology 200, consider a case illustrated in FIG. 3 where the device model is a source-drain current model ($I_D$) of an n-type field-effect-transistor (NFET). The example in FIG. 3 shows four simulations in which four input data sets (e.g., first data set i=0, second data set i=1, third data set i=2, and fourth data set i=3) are simulated to determine sensitivities for three input device parameters. As can be seen from column 302, each input data set includes the same input device parameters, namely gate length ($L_g$), threshold voltage ($V_{th}$), and electron mobility ($\mu_e$). Different data sets, however, have different parametric values for these input device parameters, and are within the contemplated scope of the present disclosure.

The first simulation (i=0), provides a baseline measurement for the model. In this simulation, the input device parameters gate length, threshold voltage, and electron mobility correspond to j=1, j=2, and j=3, respectively. Further, these parameters are set to initial parametric values, wherein, for example, $L_g$=500 nm, $V_{th}$=0.5 V, and $\mu_e$=0.025 m$^2$/(Vsec), respectively. A source-drain current $I_D$ is then calculated. In this example, the source drain current for the first simulation is calculated to be 250 nA.

In the second simulation (i=1), sensitivity analysis is carried out for a first of the parametric values (e.g., gate length or j=1). In this example, the gate length is changed from $L_g$=500 nm in the first simulation to $L_g$=150 nm in the second simulation, while $V_{th}$ and $\mu_e$ are held constant at the baseline values of 0.5 V and 0.025 m$^2$/(Vsec), respectively. With this altered gate length being used, the source-drain current is re-calculated to be 75 nA in this example. The sensitivity ($S_{j=1}$) of the model to this change in gate length is then determined by taking a ratio of the re-calculated current (75 nA) and the baseline current (250 nA), which is 75/250 and equals 0.3.

In the third simulation (i=2), sensitivity analysis is carried out for a second of the parametric values (e.g., threshold voltage, j=2). In this example, the threshold voltage is changed from $V_{th}$=0.5V in the first simulation to $V_{th}$=0.4V in the third simulation, while $L_g$ and $\mu_e$ are held constant at the baseline values of 500 nm and 0.025 m$^2$/Vsec, respectively. With this altered threshold voltage being used, the source-drain current $I_D$ is re-calculated to be 300 nA in this example. The sensitivity ($S_{j=2}$) of the model to this change in voltage threshold is then determined by taking a ratio of the re-calculated current (300 nA) and the baseline current (250 nA), which is 300/250 and equals 1.2.

Similarly, in the fourth simulation (i=3), sensitivity analysis is carried out for a third of the parametric values (e.g., electron mobility, j=3). The sensitivity ($S_{j=3}$) of the model to this change in electron mobility is determined be 150/250=0.6, by taking a ratio of the current (150 nA) and the baseline current (250 nA).

After these sensitivities, $S_{j=1}$, $S_{j=2}$, $S_{j=3}$, have been calculated, weighted sensitivities, $W_j$, are calculated by dividing each of the individual sensitivities by the largest sensitivity (here 1.2), such that the largest maximum absolute weighted sensitivity is 1. The subsequent simulations to be performed are then ordered based on these sensitivities and/or weighted sensitivities. For example, in some cases, simulations that change more sensitive input parametric values (e.g., threshold voltage) tend to be ordered so they are carried out before simulations that tend to change only less sensitive input parametric values (e.g., electron mobility or gate length). In some embodiments, the remaining input data sets to be simulated are partitioned into a first subset and a second subset. The input data sets of the first subset exhibit variations in the first input device parameter, while the input data sets of the second subset exhibit constant values for the first input device parameter but exhibit variations in the second input device parameter. Based on whether the IC model exhibits a higher sensitivity to the first or second input device parameter, the simulation order for the remaining input data sets is selectively set so one of the first subset or second subset is simulated prior to the other of the first subset or second subset. This helps to save computing time and resources relative to other approaches. Two subsets are used for illustration. Another number of subsets is within the contemplated scope of the present disclosure.

Figure 4:
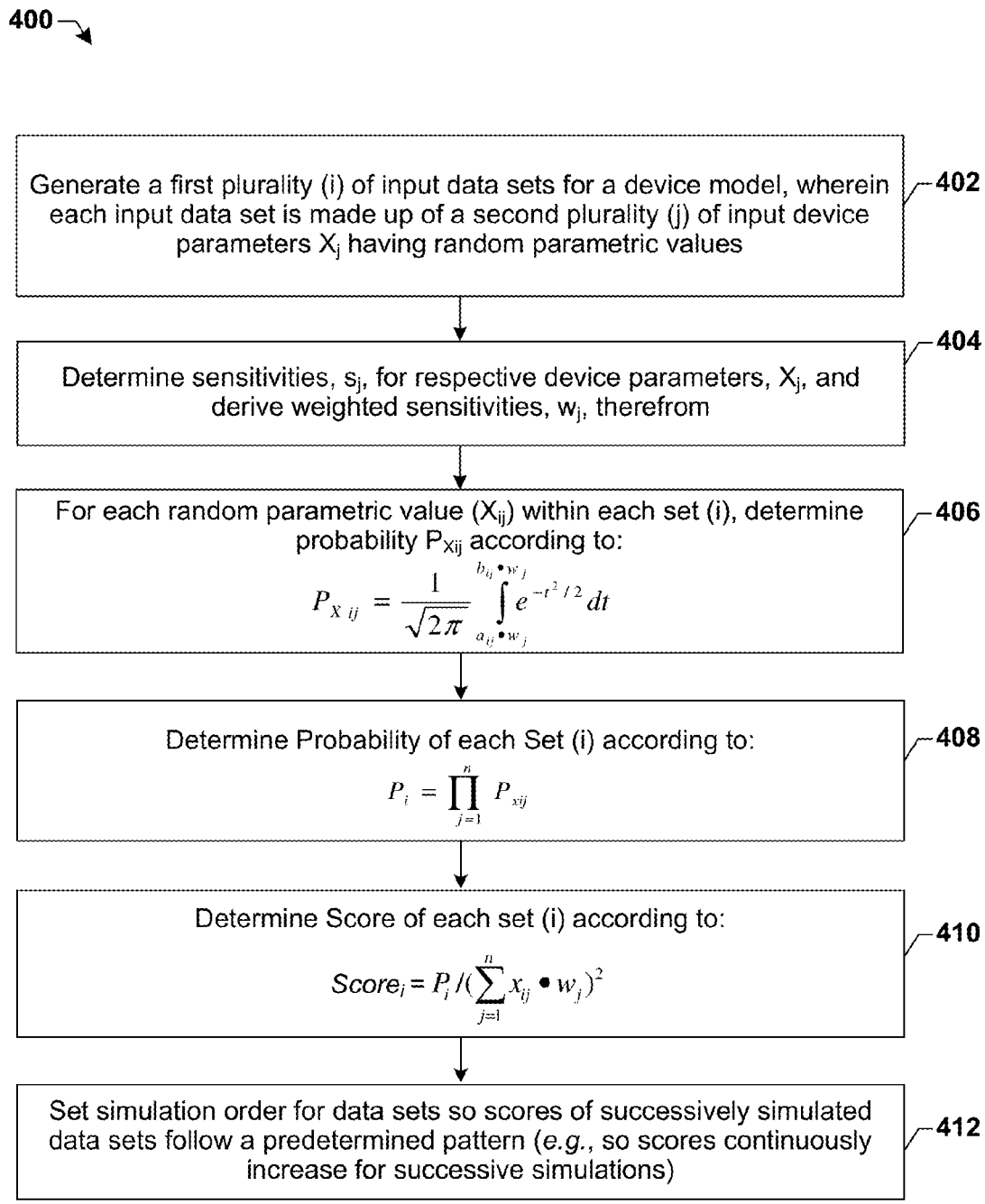
FIG. 4 illustrates a flow chart of some embodiments of a method of determining a score by which simulations are to be ordered.

FIG. 4 shows a more detailed flow-chart 400 depicting one embodiment for how scores can be determined. After these scores have been determined, simulations are carried out in an order that is based on the score. For example, simulations can be carried out so that earlier simulations have lower scores and later simulations have higher scores with scores increasing continually for successive simulations. After FIG. 4's method is described below, a more detailed numerical example will be discussed with regards to FIG. 5 further herein.

At 402, a first plurality, i, of input data sets are generated. Each input data set has a second plurality, j, of input device parameters $x_j$. For example, i=1,000,000 input data sets is generated, wherein each data set includes j=3 device parameters (e.g., gate length, threshold voltage, and electron mobility). The present method assigns each input data set a score that represents how likely that data set is to provide a worst case scenario, and simulates data sets with scores that show a higher likelihood of being a worst case scenario before those with a lower likelihood of being a worst case scenario. In this way, worst case scenarios are simulated earlier, which promotes design failures being identified earlier in the simulation process.

To enable this ordering, in 404, sensitivities, $s_j$, are determined for the respective device parameters, and weighted sensitivities, $w_j$, can be derived therefrom. For example, FIG. 3 showed an example where sensitivities $s_j$, and weighted sensitivities, $w_j$, were determined for gate length, threshold voltage, and electron mobility.

In 406, within each set i, each parametric value $x_1$ has a probability $P_{Xij}$. The probability $P_{Xij}$ is calculated according to the following Gaussian probability integral:

$$P_{Xij} = \frac{1}{\sqrt{2\pi}} \int_{a_{ij} \cdot w_j}^{b_{ij} \cdot w_j} e^{-t^2/2} dt,$$

where the integral is evaluated over a range ($a_{ij} \cdot w_j < t < b_{ij} \cdot w_j$), wherein $w_j$ is the weighted sensitivity for the parametric value being evaluated, and $a_{ij}$, $b_{ij}$ are determined prior to running a given simulation (e.g., are predetermined coefficients).

After the probability of each parametric value is calculated in 406, the method proceeds to 408 in which a set probability of each set is calculated. The total probability of each set is calculated according to:

$$P_i = \prod_{j=1}^{n} P_{xij}$$

which corresponds to taking a product of the probabilities of each value of each input parameter in the set.

In 410, the method calculates a score for each set according to:

$$\text{Score} = P_i \bigg/ \left(\sum_{j=1}^{n} x_{ij} \cdot w_j\right)^2$$

wherein $P_i$ is the Set Probability calculated in 308. In other words, to determine each Set Score, a product of each parametric value $x_{ij}$ and its corresponding weighted sensitivity $w_j$ is calculated, and the products are summed. A normalization value of the set(i) is defined as a square of the sum. The score of the set(i) is then defined as the total set probability divided by the normalization value of the set.

In 412, the method sets the simulation order so scores of successively simulated data sets follow a predetermined pattern (e.g., the scores continuously increase for successive simulations). Again, this re-ordering (or pre-ordering, in some situations) ensures that data sets with scores that show a higher likelihood of being a worst case scenario are simulated before those with a lower likelihood of being a worst case scenario. Because it is more likely that a design will fail to meet design specifications under a "worst case" scenario, simulating these cases according to their scores tends to identify failures more quickly than other methods.

To illustrate a more detailed example of how FIG. 4's methodology can be carried out, FIG. 5 has been provided. For clarity, FIG. 5's example uses the sensitivities, $s_j$, and weighted sensitivities, $w_j$, previously calculated in FIG. 3, and for ease of viewing FIG. 5 is depicted on the same drawing sheet as FIG. 3.

FIG. 5 shows a baseline simulation 502 ("nominal" corresponding to i=0 previously illustrated in FIG. 3), as well as ten additional simulations i=4, . . . , i=13 to be carried out. As with FIG. 3, the device model in FIG. 5 is a source-drain current model ($I_D$) of an n-type field-effect-transistor (NFET), and each simulation has different (e.g., randomly chosen) input data values for gate length 506 ($L_g$), threshold voltage 508 ($V_{th}$), and electron mobility 510 ($\mu_e$). In some embodiments, each of these input data values is randomly chosen from a process model that emulates a manufacturing process at a fabrication facility. In this process model, each input device parameter can be represented by a probability distribution, such as a Gaussian distribution. For example, each gate length ($L_g$) parametric value can be sampled from a continuous probability ($P_L$) distribution, which includes a mean gate length ($\overline{L_g}$) and a standard deviation $\sigma_L$. The probability curve $P_L$ represents variations in gate length expected to be encountered when a large number of devices are manufactured in the IC fabrication facility. In some embodiments, these gate lengths of the probability curve $P_L$ are centered about the mean gate length $\overline{L_g}$. Threshold voltage and electron mobility also have similar distributions, albeit that they can have different means and standard deviations from one another.

Within each input data set, each randomly selected parametric value has a corresponding parametric value probability. In the illustrated example of i=8 in FIG. 5, consider a flow where the mean, target gate length $\overline{L_g}$ is 800 nm and the parametric value for the gate length $L_{Gij}$ is 790 nm. The parametric value probability of this 790 nm gate length is determined to be 9% as indicated on FIG. 5's chart at 507. Similarly, the parametric value probability of the gate threshold voltage is determined to be 15% (see 509, FIG. 5) and the electron mobility is determined to be 13% (see 511, FIG. 5).

After the parametric values $X_{ij}$ and their corresponding parametric value probabilities $P_{Xij}$ are determined, a Set Probability is calculated. See column 512 in FIG. 5. In FIG. 5's example, the i=8 set has a Set Probability of $P_{XLG}*P_{XVT}*P_{X\mu e}$ (i.e., $P_i$=0.09*0.13*0.15=0.0011).

Finally, after the Set Probability is determined in column 512, the Set Score is determined. See column 514 of FIG. 5. In FIG. 5's example, the set score for set i=8 equals:

$$P_i \bigg/ \left(\sum_{j=1}^{n} x_{ij} \cdot w_j\right)^2 =$$

$$0.0011 \bigg/ \left[\{((790 \times 10^{-9}) \times 0.09) + (0.1 \times 0.15) + (0.02 \times 0.13)\}^2\right] = 3.$$

Although parametric value probabilities in FIG. 5's chart are only illustrated for set i=8, it will be appreciated that parametric value probabilities are also determined for other Input Data Sets to allow Set Scores to be determined for each of the other sets. Once the Set Scores are determined in column 514, the simulations can be ordered so that the set scores for successive simulations follow a predetermined pattern. Some embodiments of this predetermined pattern can involve the lowest score (e.g., set i=8) being simulated first, and each successive simulation having an increasing score until all simulations have been performed. However, in other embodiments the highest score could be simulated first and each successive simulation could have a decreasing score until all simulations have been performed.

Figure 6:
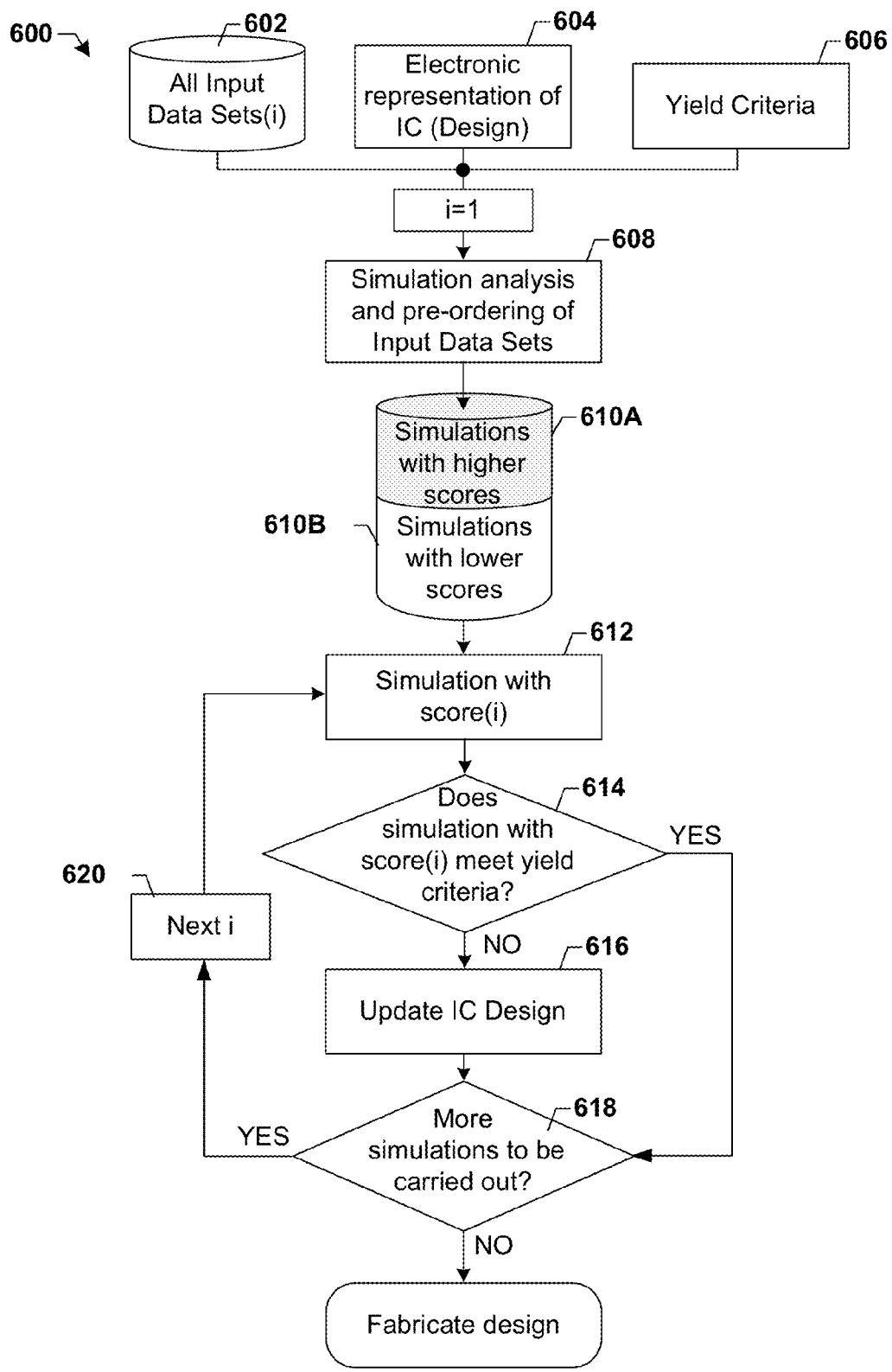
FIG. 6 illustrates some embodiments of a design-for-yield flow.

FIG. 6 illustrates some embodiments of a design-for-yield flow 600. An integer number, i, of random input data sets 602 are generated, wherein respective input data sets comprise a set of randomly-generated values for input parameters of an IC design 604. A predetermined yield criteria 606 is also specified. The yield criteria 606 gives a measure for what fraction of devices function within tolerances set by a design specification. For example, if a design specification requires an IC design to successfully operate at a clock speed of 500 MHz+/−2 MHz at 80° C., and fifty-thousand of these IC are manufactured, but only 48,000 operate at the required operating condition, the yield is 48,000/50,000, which equates to 24/25 or 96%.

The analysis step at 608 incorporates the methods discussed in the embodiments of FIGS. 3-5, and in so doing assigns scores to the various input data sets which are to be simulated. The input data sets are then pre-ordered according to their scores. For example, input data sets with the lowest scores can be assigned to earlier simulation in 610A, while those with higher scores can be assigned to later simulations in 610B. After the simulations have been ordered according to their scores, a simulation tool such as a SPICE simulation tool, performs the first (i=1) simulation in 612.

At 614, the method determines whether the most recent simulation meets the yield criteria specified in 606. If the result of the simulation fails to meet the yield criteria (NO at 614), the circuit designer can stop simulating and update the circuit design in 816 without carrying out additional simulations. On the other hand, if the most recent simulation does meet the yield requirements (YES at 614), the method proceeds to 618 and evaluates whether additional simulations are to be carried out. If so (YES at 618), the method moves onto the next input data set by incrementing i in 620, and simulating the input data set having the next successive score (e.g., next lowest remaining score) in 612. The simulations continue to be run in iterative fashion until the yield requirements fail to be met (NO in 614) or until all of the simulations have been carried out (NO at 618).

Figure 7:
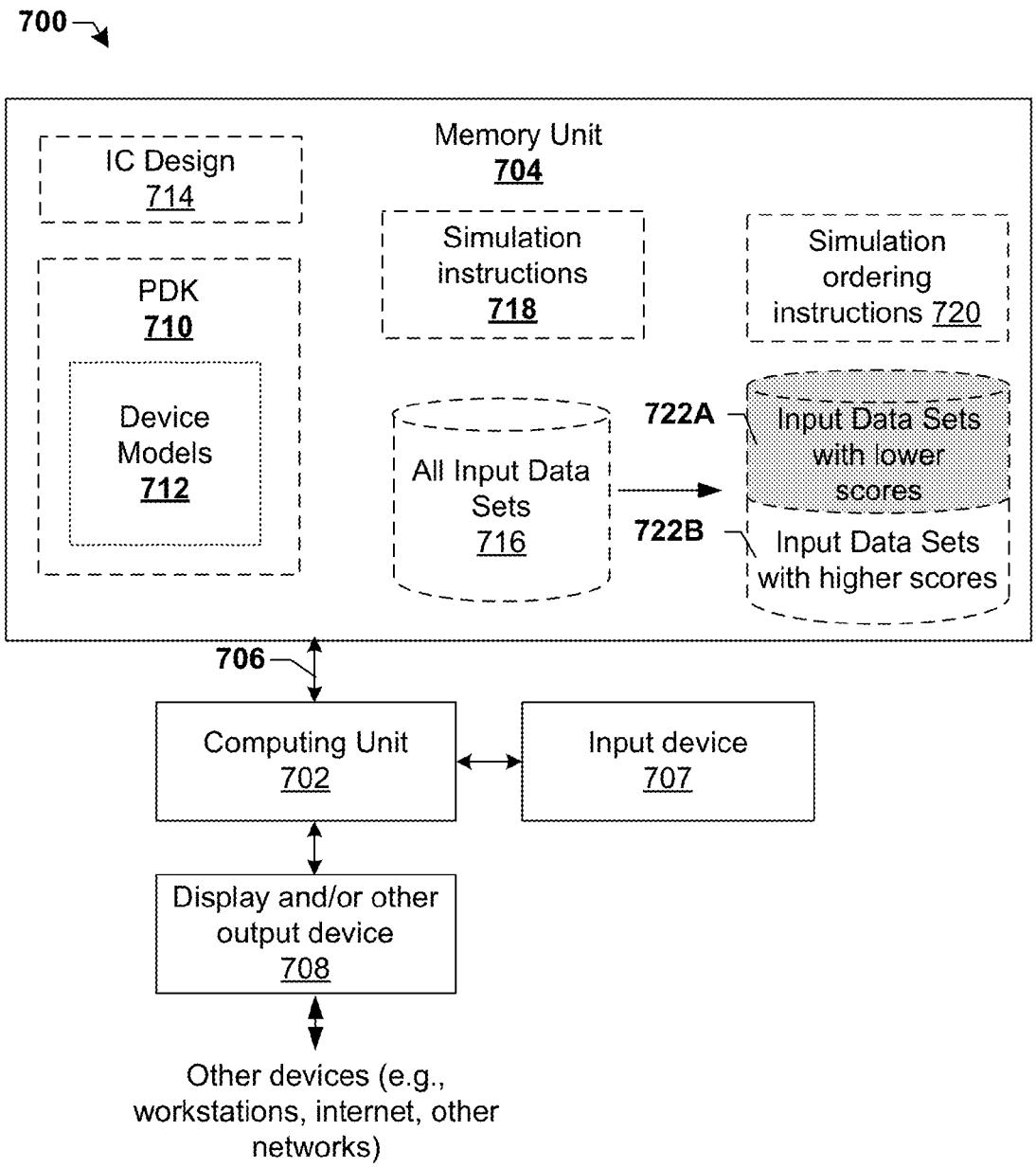
FIG. 7 illustrates some embodiments of a tool arrangement for circuit design.

FIG. 7 illustrates some embodiments of a tool arrangement 700 for circuit design. The tool arrangement includes a computing unit 702, such as one or more microprocessors, which is operably coupled to a memory unit 704 via one or more busses 706. Based on computer executable instructions stored in memory 704, the computing unit 702 is capable of performing the methods previously described in this disclosure. To facilitate this behavior, the tool arrangement 700 also includes an input device 707, such as a keyboard or other mechanism for one or more designers to enter data into the tool arrangement 700. A visual display 708 and/or other output device, such as a printer, is also coupled to the computing unit 702 to allow a designer to view the simulation results and/or IC designs provided by the tool arrangement 700. Other output devices may allow the tool arrangement to be coupled to other devices (e.g., workstations) and/or to the internet, local area network, or wide area network for example.

Memory unit 704 is configured to store digitized data representing a process design kit (PDK) 710, which can include device models 712 provided by a fabrication facility across process corners. The memory unit 704 can also store an IC design 714, which is to be evaluated over a wide range of process conditions which are specified by data input sets 716. Lastly, computer executable simulation instructions 718, such as provided by a CADENCE VIRTUOSO or MENTOR GRAPHICS software package, and simulation ordering instructions 720, are included.

During operation, computing unit 702, typically after receiving a command from the input device 707, executes simulation ordering instructions 720, and then sets a simulation order for all the input data sets 716 based on the instructions 720. For example, the simulation ordering instructions 720 can assign scores to the respective input data sets 716, and then pre-order simulations so that input data sets with lower scores 722A are to be simulated first, while input data sets with higher scores 722B are to be simulated later.

When the simulation order is set, the computing unit 702 loads the first input data set (e.g., having the lowest score), along with relevant device models 712 from PDK 710, and the proposed IC design 714; and carries out the simulation instructions 718. The computing unit 702 can then display the results of the simulation to the display 708, depending on user input from input device 707. Simulations for respective input data sets 716 are then carried out in a similar manner until all input data sets 716 have been simulated, or until a worst case scenario is identified where the IC design 714 fails to meet its design specification.

It will be appreciated that equivalent alterations and/or modifications may occur to one of ordinary skill in the art based upon a reading and/or understanding of the specification and annexed drawings. The disclosure herein includes all such modifications and alterations and is generally not intended to be limited thereby. In addition, while a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein; such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein. Some embodiments of the present disclosure relate to a simulation method. In this method, a plurality of input data sets are provided for an integrated circuit (IC) model. A first simulation is carried out by applying a first of the plurality of input data sets to the IC model to generate a first simulation result. The first input data set includes a first input device parameter with a first baseline parametric value and a second input device parameter with a second baseline parametric value. A second simulation is carried out by applying a second of the plurality of input data sets to the IC model to generate a second simulation result. The second input data set includes the first input device parameter but with a first parametric value that differs from the first baseline parametric value and also includes the second input device parameter with the second baseline parametric value. A sensitivity of the IC model to the first input device parameter is determined by comparing results of the first and second simulations. A simulation order for remaining input data sets of the plurality of input data sets is defined according to the sensitivity of the IC model to the first input device parameter.

Other embodiments relate to a simulation method. In this method, a plurality of input data sets is provided for an integrated circuit (IC) model. A plurality of scores for the plurality of input data sets, respectively, are then determined based on probabilities of the respective input data sets resulting in a failure condition, which exists when the IC model fails to meet a predetermined yield criteria. A simulation order for the plurality of input data sets is then defined according to the determined plurality of scores.

Still other embodiments relate to a tool arrangement for circuit design. The tool arrangement includes a computing unit to process computer executable instructions and a memory operably coupled to the computing unit. The memory is configured to store: a plurality of input data sets for an integrated circuit (IC) design. The memory is also configured to store simulation ordering instructions to determine a simulation order for the plurality of input data sets based on probabilities of the respective input data sets resulting in a failure condition, which exists when the IC model fails to meet a predetermined yield criteria. The memory is also configured to store simulation instructions to carry out simulations of the input data sets in the simulation order.

Still other embodiments relate to a simulation method. The method provides a plurality of input data sets for an integrated circuit (IC) model. A first simulation is performed by applying a first of the plurality of input data sets to the IC model to generate a first simulation result. The first input data set includes a first input device parameter with a first baseline parametric value and a second input device parameter with a second baseline parametric value. A second simulation is performed by applying a second of the plurality of input data sets to the IC model to generate a second simulation result. The second input data set includes the first input device parameter but with a first parametric value that differs from the first baseline parametric value and also includes the second input device parameter with the second baseline parametric value. A third simulation is performed by applying a third of the plurality of input data sets to the IC model to generate a third simulation result. The third input data set includes the first input device parameter with the first baseline parametric value and also includes the second input device parameter but with a second parametric value that differs from the second baseline parametric value. First and second sensitivities of the IC model to the first and second input device parameters, respectively, are determined by comparing results of the first simulation to the second and third simulations, respectively. First and second weighted sensitivities are determined for the first and second input data parameters, respectively, by dividing the first and second sensitivities by a larger of the first and second sensitivities. A simulation order for remaining input data sets of the plurality of input data sets is defined according to the weighted sensitivity of the IC model to the first input device parameter.

While a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein, such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein.

What is claimed is:

1. A simulation method, comprising:
providing a plurality of input data sets for an integrated circuit (IC) model;
performing a first simulation using a computing unit by applying a first of the plurality of input data sets to the IC model to generate a first simulation result, wherein the first input data set includes a first input device parameter with a first baseline parametric value and a second input device parameter with a second baseline parametric value;
performing a second simulation by applying a second of the plurality of input data sets to the IC model to generate a second simulation result, wherein the second input data set includes the first input device parameter but with a first parametric value that differs from the first baseline parametric value and also includes the second input device parameter with the second baseline parametric value;
determining a sensitivity of the IC model to the first input device parameter by comparing results of the first and second simulations;
defining a simulation order for remaining input data sets of the plurality of input data sets according to the sensitivity of the IC model to the first input device parameter; and
manufacturing an integrated circuit on a semiconductor substrate, wherein the manufactured integrated circuit corresponds to the IC model.

2. The method of claim 1 further comprising:
performing a third simulation by applying a third of the plurality of input data sets to the IC model to generate a third simulation result, wherein the third input data set includes the first input device parameter with the first baseline parametric value and also includes the second input device parameter but with a second parametric value that differs from the second baseline parametric value;
determining a sensitivity of the IC model to the second input device parameter by comparing results of the first and third simulations; and
defining a simulation order for the remaining input data according to the sensitivity of the IC model to the second input device parameter.

3. The method of claim 2:
wherein determining the sensitivity of the IC model to the first input device parameter comprises determining a first difference between the first simulation result and the second simulation result;
wherein determining the sensitivity of the IC model to the second input device parameter comprises determining a second difference between the first simulation result and the third simulation result.

4. The method of claim 3, further comprising:
partitioning the remaining input data sets into a first subset and a second subset, wherein the input data sets of the first subset exhibit variations in the first input device parameter and the input data sets of the second subset exhibit variations in the second input device parameter; and
based on whether the IC model exhibits a higher sensitivity to the first or second input device parameter, selectively defining the simulation order for the remaining input data sets so one of the first subset or second subset is simulated prior to the other of the first subset or second subset.

5. The method of claim 1, further comprising:
determining a first set probability of the first input data set by calculating a product of parametric value probabilities for respective input data parameters in the first input data set;
multiplying parametric value probabilities for respective input data parameters in the second input data set to determine a second set probability of the second input data set; and
defining the simulation order according to the first and second set probabilities.

6. The method of claim 5, further comprising:
determining a total probability of each input data set as a product of the probabilities of each parametric value of each input device parameter in the input data set; and
determining the simulation order for the plurality of input data sets from the total probability of each input data set.

7. The method of claim 6, wherein defining the simulation order for the plurality of input data sets further comprises:
summing a product of each random value of a respective input data set and its weighted sensitivity;

defining a normalization value of the set of as a square of the sum; and defining a score of the set as the total probability of the set divided by the normalization value of the input data set.

8. The method of claim 7, wherein the simulation order for the plurality of input data sets is determined from a lowest score to a highest score.

9. The method of claim 1 further comprising:

based on the determined sensitivities, calculating respective scores for the remaining respective input data sets prior to simulating the respective input data sets; and setting the simulation order so successive scores for the remaining respective input data sets follow a predetermined pattern.

10. The method of claim 9, wherein the predetermined pattern is followed when successive scores are continuously increasing or continuously decreasing over for successive simulations for the remaining input data sets.

11. A simulation method, comprising:

providing a plurality of input data sets for an integrated circuit (IC) model;

determining a plurality of scores for the plurality of input data sets, respectively, wherein each score is based on a probability that a corresponding input data set on which the score is based is expected to result in a failure condition where the IC model fails to meet a predetermined yield criteria;

assigning a simulation order for the plurality of input data sets according to the determined plurality of scores; and manufacturing an integrated circuit on a semiconductor substrate, wherein the manufactured integrated circuit corresponds to the IC model.

12. The method of claim 11, further comprising:

simulating at least some of the plurality of input data sets according to the determined plurality of scores; and after an input data set is simulated, evaluating whether a result of that simulation meets the predetermined yield criteria.

13. The method of claim 12, wherein if the result does not meet the predetermined criteria, halting simulations for the remaining input data sets so that revisions to the IC model can be made.

14. The method of claim 12, wherein if the result does meet the predetermined criteria, determining if additional simulations for the input data sets remain to be carried out.

15. A tool arrangement for circuit design, comprising:

a computing unit to process computer executable instructions; and a memory operably coupled to the computing unit, the memory configured to store: a plurality of input data sets for an integrated circuit (IC) model, simulation ordering instructions to determine a simulation order for the plurality of input data sets based on probabilities of the respective input data sets resulting in a failure condition where the IC model fails to meet a predetermined yield criteria, and simulation instructions to carry out simulations of the input data sets in the simulation order, wherein the simulation ordering instructions are configured to assign scores to respective input data sets based on the probabilities of the respective input data sets; and a semiconductor substrate on which the IC model is fabricated.

16. The tool arrangement of claim 15, wherein the plurality of input data sets include randomly selected parametric values that are chosen to fall within process corners provided by a fabrication facility.

17. A simulation method, comprising:

providing a plurality of input data sets for an integrated circuit (IC) model;

performing a first simulation by applying a first of the plurality of input data sets to the IC model to generate a first simulation result, wherein the first input data set includes a first input device parameter with a first baseline parametric value and a second input device parameter with a second baseline parametric value;

performing a second simulation by applying a second of the plurality of input data sets to the IC model to generate a second simulation result, wherein the second input data set includes the first input device parameter but with a first parametric value that differs from the first baseline parametric value and also includes the second input device parameter with the second baseline parametric value;

performing a third simulation by applying a third of the plurality of input data sets to the IC model to generate a third simulation result, wherein the third input data set includes the first input device parameter with the first baseline parametric value and also includes the second input device parameter but with a second parametric value that differs from the second baseline parametric value;

determining first and second sensitivities of the IC model to the first and second input device parameters, respectively, by comparing results of the first simulation to the second and third simulations, respectively;

calculating first and second weighted sensitivities for the first and second input data parameters, respectively, by dividing the first and second sensitivities by a larger of the first and second sensitivities;

defining a simulation order for remaining input data sets of the plurality of input data sets according to the weighted sensitivity of the IC model to the first input device parameter; and manufacturing an integrated circuit on a semiconductor substrate, wherein the manufactured integrated circuit corresponds to the IC model.

* * * * *